US012689386B2

(12) United States Patent
Molendijk et al.

(10) Patent No.: US 12,689,386 B2
(45) Date of Patent: Jul. 21, 2026

(54) TI ADC TIME SKEW BACKGROUND CALIBRATION USING THE COMPLEX DERIVATIVE SIGNAL

(71) Applicant: NXP B.V., Eindhoven (NL)

(72) Inventors: Maarten Jelmar Molendijk, Eindhoven (NL); Robert van Veldhoven, Valkenswaard (NL)

(73) Assignee: NXP B.V., Eindhoven (NL)

( * ) Notice: Subject to any disclaimer, the term of this patent is extended or adjusted under 35 U.S.C. 154(b) by 132 days.

(21) Appl. No.: 18/918,271

(22) Filed: Oct. 17, 2024

(65) Prior Publication Data

US 2026/0113049 A1      Apr. 23, 2026

(51) Int. Cl.
| *H03M 1/06* | (2006.01) |
| *H03M 1/08* | (2006.01) |
| *H03M 1/10* | (2006.01) |

(52) U.S. Cl.
CPC ....... *H03M 1/0626* (2013.01); *H03M 1/0836* (2013.01); *H03M 1/1014* (2013.01)

(58) Field of Classification Search
CPC . H03M 1/0626; H03M 1/0836; H03M 1/1014
USPC ................................................ 341/118, 155
See application file for complete search history.

(56) References Cited

U.S. PATENT DOCUMENTS

| | | | |
|---|---|---|---|
| 8,502,712 B2 | 8/2013 | Waki et al. | |
| 8,654,000 B2 * | 2/2014 | Waltari | ............... H03M 1/0626 |
| | | | 341/166 |
| 8,957,798 B1 * | 2/2015 | Harris | ................. H03M 1/1038 |
| | | | 341/120 |
| 11,101,810 B1 | 8/2021 | Van Veldhoven | |
| 11,722,146 B1 | 8/2023 | Van Veldhoven | |
| 2022/0019883 A1 | 1/2022 | Van Veldhoven | |

OTHER PUBLICATIONS

Lu, Y., "A Digital Calibration Technique for Frequency Response Mismatches in M-Channel Time-Interleaved ADCs Based on Taylor Approximation", 2021 IEEE 21st International Conference on Communication Technology (ICCT), Oct. 13-16, 2021.
Matsuno, J., "All-Digital Background Calibration Technique for Time-Interleaved ADC Using Pseudo Aliasing Signal", IEEE Transactions on Circuits and Systems—I: Regular Papers, vol. 60, No. 5, May 2013.

(Continued)

*Primary Examiner* — Khai M Nguyen

(57) ABSTRACT

Disclosed is a circuit including timer interleaved (TI) analog-to-digital converter (ADC) circuitry which generates digital output signals. Correction circuitry receives the digital output signals from the TI ADC circuitry and generates corrected output signals using weight values to correct time skew. The correction circuitry includes a derivative filter which removes frequency dependency between the weight values and input signals to the TI ADC circuitry. Weight updating circuitry receives the corrected output signals and generates updated weight values for the correction circuitry. The weight updating circuitry includes a notch filter which suppresses spectral content in the corrected output signals to cancel spurious correlations in the weight updating process.

20 Claims, 11 Drawing Sheets

(56) References Cited

OTHER PUBLICATIONS

Qiu, Y., "All-Digital Blind Background Calibration Technique for Any Channel Time-Interleaved ADC", IEEE Transactions on Circuits and Systems—I: Regular Papers, vol. 65, No. 8, Aug. 2018.

U.S. Appl. No. 18/201,085, Molendijk et al., entitled "Time Interleaved Analog-To-Digital Converter With ADC Unit Correction," filed May 23, 2023.

U.S. Appl. No. 18/218,366, Molendijk et al., entitled "Inter-Symbol Interference Compensation for Analog-To-Digital Converter," filed Jul. 5, 2023.

Duc, H., "A Fully Digital Background Calibration of Timing Skew in Undersampling TI-ADC", 2014 IEEE 12th International New Circuits and Systems Conference (NEWCAS), DOI: 10.1109/NEWCAS.2014.6933983, Jun. 22-25, 2014.

\* cited by examiner

TIME-SKEW ERRORS VS. BW MISATCH

Skew $$\tilde{X}(j\omega) = \tfrac{1}{2}\left\{e^{j\omega\Delta t_0} + e^{j\omega\Delta t_1}\right\}X(j\omega) + \tfrac{1}{2}\left\{e^{j(\omega-\pi)\Delta t_0} - e^{j(\omega-\pi)\Delta t_1}\right\}X(j(\omega-\pi))$$

Taylor approx (assumes $\Delta t_i \ll T_s$)

$$\tilde{X}(j\omega) = \tfrac{1}{2}\left\{2 + j\omega\cdot(\Delta t_0 + \Delta t_1)\right\}X(j\omega) + \tfrac{1}{2}\left\{j(\omega-\pi)\cdot(\Delta t_0 - \Delta t_1)\right\}X(j(\omega-\pi))$$

Bandwidth Mismatch $$\tilde{X}(j\omega) = \tfrac{1}{2}\left\{\frac{1}{1+j\frac{\omega}{\omega_{p1}}} + \frac{1}{1+j\frac{\omega}{\omega_{p2}}}\right\}X(j\omega) + \tfrac{1}{2}\left\{\frac{1}{1+j\frac{\omega-\pi}{\omega_{p1}}} - \frac{1}{1+j\frac{\omega-\pi}{\omega_{p2}}}\right\}X(j(\omega-\pi))$$

Taylor approx (assumes $\omega_{p,i} \gg 2\pi f_s$)

$$\tilde{X}(j\omega) = \tfrac{1}{2}\left\{2 - j\omega(\frac{1}{\omega_{p,1}} + \frac{1}{\omega_{p,2}})\right\}X(j\omega) + \tfrac{1}{2}\left\{-j(\omega-\pi)(\frac{1}{\omega_{p,1}} - \frac{1}{\omega_{p,2}})\right\}X(j(\omega-\pi))$$

Fig. 11

TI ADC TIME SKEW BACKGROUND CALIBRATION USING THE COMPLEX DERIVATIVE SIGNAL

BACKGROUND

Time-interleaved (TI) analog-to-digital converters (ADCs) use multiple ADC channels operating in parallel to sample an input signal at distinct time points. Non-uniformly spaced sampling moments can cause errors.

BRIEF DESCRIPTION OF DRAWINGS

The present invention may be better understood, and its numerous objects, features, and advantages made apparent to those skilled in the art by referencing the accompanying drawings.

FIG. 11 illustrates differences in time skew and bandwidth mismatch errors for a 2-way interleaved ADC system.

DETAILED DESCRIPTION

The concepts disclosed in this discussion are described and illustrated by referring to illustrative embodiments. These concepts, however, are not limited in their application to the details of construction and the arrangement of components in the illustrative embodiments and are capable of being practiced or being carried out in various other ways. The terminology in this document is used to describe illustrative embodiments and should not be regarded as limiting. Words such as "including," "comprising," and "having" and variations thereof as used herein are meant to encompass the items listed thereafter, equivalents thereof, as well as additional items.

Disclosed embodiments include circuits and methods which may mitigate the effect of non-uniformly spaced sampling moments when using a time-interleaved (TI) analog-to-digital converter (ADC). At least some of the disclosed embodiments and solutions can be tuned to reduce hardware costs or to improve performance. At least some of the disclosed embodiments are not dependent on the frequency of the tones that appear in the (distorted) output signal of the ADC, nor are at least some of the disclosed embodiments limited in applicability to a specific number of TI slices. Using disclosed methods, timing spurs may be calibrated for a TI ADC by using background calibration. For at least some embodiments, the calibration algorithm does not require a ground-truth signal to identify the correct compensation and is therefore able to run in the background, i.e. during normal operation of the ADC.

In exemplary embodiments, the output signal of an ADC is mixed to the frequency at which the time interleaving spurs due to skew appear. With some embodiments, no prior knowledge on the output signal of the ADC is required, nor is the signal required to have specific spectral content.

Figure 1:
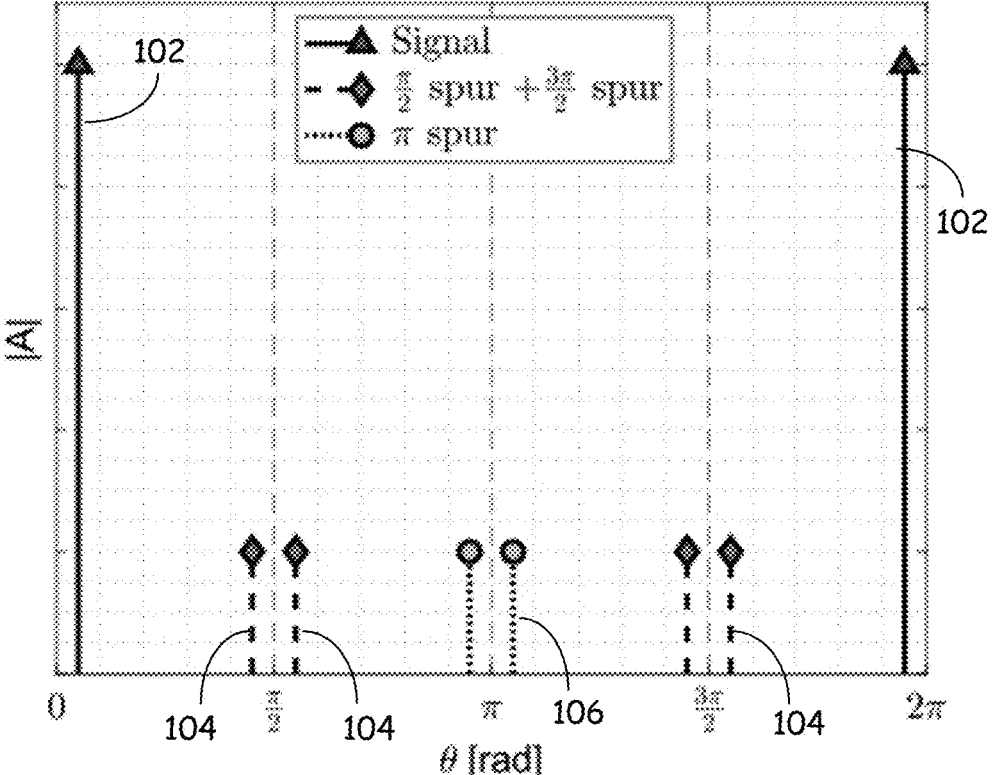
FIG. 1 is a frequency spectrum diagram of a single-tone signal with time-interleaving spurs for a time-interleaved (TI) analog-to-digital (ADC).

The timing skew frequencies are known to appear at integer multiples of $f_s/M \pm f_{in}$, where $f_s$ is the sampling frequency of the full system and M is the time-interleaving factor. An example frequency spectrum with timing spurs is shown in FIG. 1, where 0 denotes the normalized frequency: $\theta = 2\pi f/f_s$. This exemplary frequency spectrum is of a single-tone signal with time-interleaving spurs (in this example TI=4). The pole 102 denotes the signal component (which ideally is the only component), whereas the poles 104 and 106 are artifacts added to the spectrum due to the non-uniform sampling moment of the TI slices. The amplitude of the signals shown in FIG. 1 are not to scale. The real signal is symmetric around 71 radians (=fs/2).

In exemplary embodiments, the magnitude of the timing-skew correction is roughly proportional to the input frequency. Using a derivative Finite Impulse Response (FIR) filter, this dependency is removed from the calibration logic, simplifying the required circuitry. The calibration algorithm uses cross-correlation between the input signal and the mixed and frequency-scaled input signal to learn a complex weight with the correct magnitude and phase.

Figure 2:
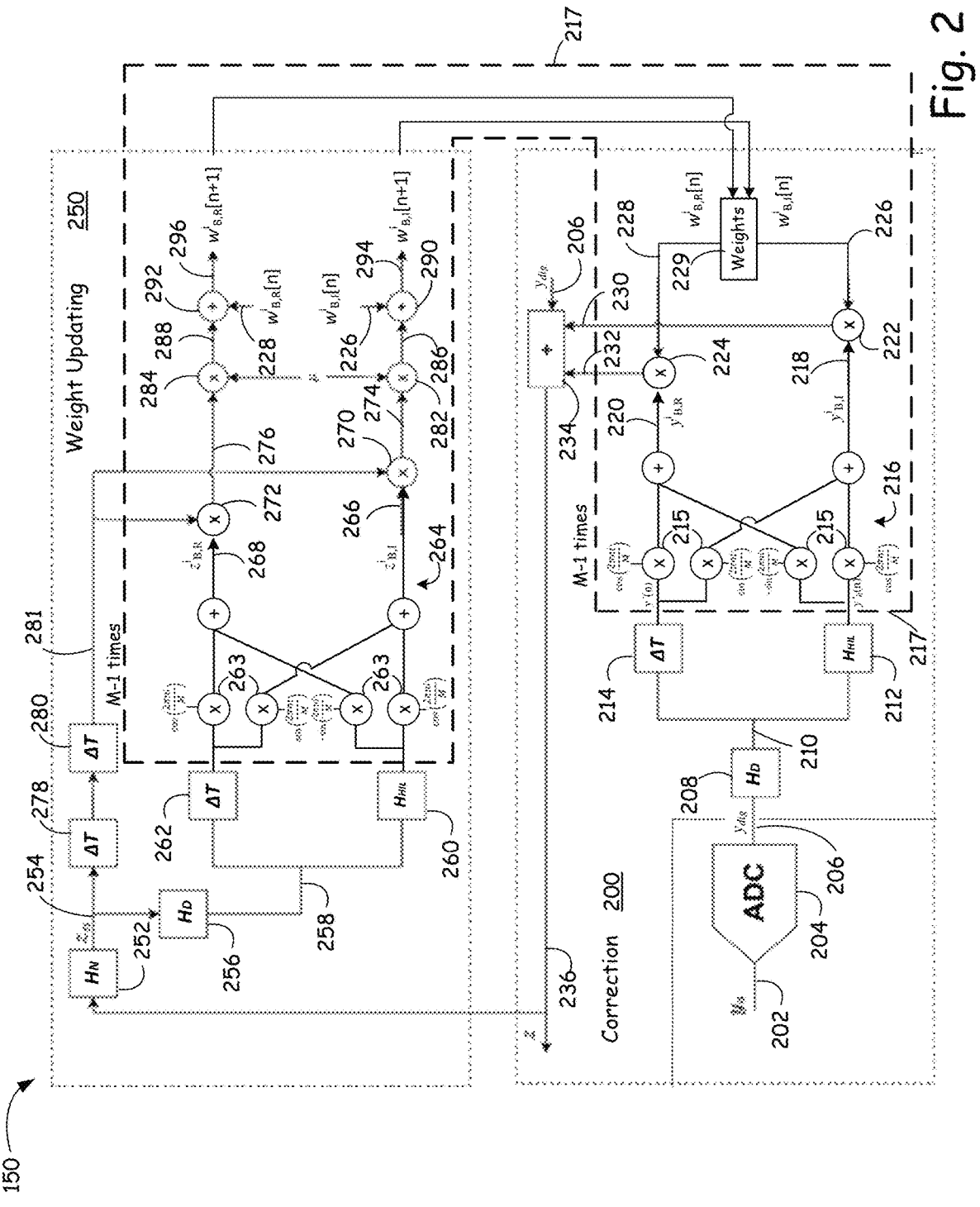
FIG. 2 is a circuit diagram of an ADC calibration circuit including correction circuitry configured to correct the ADC output under influence of timing skew and weight updating circuitry configured to calculate updates for weights used by the correction circuitry.

A calibration circuit 150 configured to implement a calibration algorithm or correction scheme is shown in FIG. 2 in block diagram form. The circuit 150 includes correction circuitry 200 and weight updating circuitry 250. Correction circuitry 200 is configured to correct the ADC output under influence of timing skew, while weight updating circuitry 250 is configured to calculate updates for weights used by correction circuitry 200. Correction circuitry 200 and weight updating circuitry 250 include circuit components which are described, along with their configured functionality, below.

Referring more specifically now to correction circuitry 200, responsive to an input signal 202, ADC 204 generates an ADC digital output 206 ($y_{dig}$). ADC 204 provides the time-multiplexed output comprised of M ADC channels. While in some embodiments ADC 204 is considered part of correction circuitry 200, in other embodiments the ADC provides the digital output 206 to the correction circuitry, but the ADC is itself not considered part of correction circuitry 200. The ADC digital output 206 is provided to a derivative filter 208 ($H_D$). Passing the digital output 206 through derivative filter 208 scales the input tone(s) in the ADC digital output. The amplitude of the skew induced tones for higher frequency inputs given a certain time skew is larger, and this filter 208 removes that dependency. The output 210 of derivative filter 208 is the derivative of ADC digital output 206 ($y_{dig}$).

The derivative of $y_{dig}$ provided at output 210 of derivative filter 208 is split and passes through a Hilbert filter ($H_{HIL}$) 212 to produce $y'_h(n)$ and a delay block ($\Delta T$) 214 to produce $y'(n)$. The delay block 214 has the same delay as the filter 212. In exemplary embodiments, the Hilbert filter 212 ideally has a unity gain over the full bandwidth and a constant phase shift of either +90 or −90 degrees depending upon whether the frequencies are positive or negative. Since the skew error introduced in the TI system is a phase error, the correction mechanism needs to compensate this error using a complex signal. To create the complex signal, a Hilbert transform can be applied. By adding the Hilbert transform to the original signal, any phase shift can be achieved. Further discussion of exemplary embodiments of Hilbert filter 212 is provided further below.

The Hilbert transform $y'_h(n)$ provided at the output of filter 212 and the delayed derivative $y'(n)$ of $y_{dig}$ provided at the output of delay block 214 are provided as inputs to mixer circuit 216. Mixer circuit 216 illustrates one of M-1 mixing functions or mixing circuits which are implemented in parallel. The M-1 mixer circuits 216 are collectively represented by a single mixer circuit for illustrative purposes. The M-1 mixer circuits, as well as M-1 instances of other components within correction circuitry 200 and weight updating circuitry 250, are designated within dashed lines 217. Each of the M-1 instances of the mixing circuitry differs by mixing frequency. For example, if M=4, the four sinusoids that are applied to signals $y'(n)$ and $y'_h(n)$ at the input of the multipliers 215 of mixing circuit 216 (and multipliers 263 of mixing circuit 264), from top to bottom, in each of the three (M-1) instances of 217 are: $\cos(2\pi ni/4)$, $\sin(2\pi ni/4)$, $-\sin(2\pi ni/4)$, $\cos(2\pi ni/4)$ where 'i' denotes one of the instances of the parallel mixing circuit and 'n' denotes a point in discrete time (sampled at the system sample rate $f_s$). Therefore, for the first instance (i=1), the modulating signals, from top to bottom are given by: $\cos(2\pi n/4)$, $\sin(2\pi n/4)$, $-\sin(2\pi n/4)$, $\cos(2\pi n/4)$. For the second instance (i=2), the modulating signals, from top to bottom are given by: $\cos(2\pi n/2)$, $\sin(2\pi n/2)$, $-\sin(2\pi n/2)$, $\cos(2\pi n/2)$. For the third instance (i=3), the modulating signals, from top to bottom are given by: $\cos(3\cdot2\pi n/4)$, $\sin(3\cdot2\pi n/4)$, $-\sin(3\cdot2\pi n/4)$, $\cos(3\cdot2\pi n/4)$.

A complex signal $y^i_{B,I}$ 218, $y^i_{B,R}$ 220 is created by mixing the derivative $y'(n)$.of $y_{dig}$ and its Hilbert transform $y'_h(n)$ with sinusoids at integer multiples of $f_s/M$ M-1 times using the M-1 mixer circuits, thus mixing the input tones up to one of the skew spur locations. Equations 1 discussed further below illustrate the functions used to create the complex signal $y^i_{B,I}$ 218, $y^i_{B,R}$ 220. The complex signal 218, 220 is then multiplied using product or multiplier circuitry 222, 224 by a learned complex weight ($w^i_{B,R}$ & $w^i_{B,I}$) shown at 228, 226 to produce weighted complex signal 230, 232. In the complex weights ($w^i_{B,R}$ & $w^i_{B,I}$) shown in FIG. 2, the superscript 'i' denotes the range $\{1, 2, \ldots . M-1\}$, illustrating that there is a pair of weights for each mixer. As the correction circuitry 200 includes circuitry for implementing M-1 mixing functions 216 and M-1 corresponding weight multiplier functions 222, 224, these components are represented for illustrative purposes within dashed lines 217 as being implemented M-1 times. Dashed lines 217 also illustrate other components within correction circuitry 200 and weight updating circuitry 250, such as weight updating circuits, which are implemented M-1 times, with these other components being discussed below.

The learned complex weights 229 can be obtained from complex weight storage 229. The complex weights are provided by weight updating circuitry 250 described below.

In some exemplary embodiments, the weight updating circuitry initially sets the complex weights to zero and the circuitry quickly adjusts the weights to required values. In other embodiments, however, the initial complex weight values can be set to values other than zero. The weighted complex signals 230, 232 are subsequently subtracted from the uncorrected ADC output signal $y_{dig}$ 206 using subtraction circuit 234 to create a corrected output signal 'z' at output 236. Corrected signal z at output 236 is the corrected ADC output signal. In circuit 234, the contributions of each of the mixer circuit's (M-1) outputs are combined into one signal, which is possible due to the scaling of all of the (M-1) parallel instances using different weights $w^i$, thus allowing separate scaling of these contributions that were mixed to different frequencies before they are added into the final compensated signal.

Referring now to weight updating circuitry 250 of calibration circuit 150, the corrected signal z is provided to a notch filter ($H_N$) 252 that is configured to suppress any input tones around integer multiples of $f_s/M$, which hinder the weight updating process, in the filtered signal $z_n$ provided at filter output 254. The filtered signal $z_n$ at filter output 254 is passed through a derivative filter 256 ($H_D$), which is configured to scale the input tone(s). Similar to the function of derivative filter 208, the amplitude of the skew induced tones for higher frequency inputs given a certain time skew is larger, and filter 256 removes that dependency.

The derivative of the filtered signal $z_n$ provided at output 258 of derivative filter 256 is split and passes through a Hilbert filter ($H_{HIL}$) 260 and a delay block ($\Delta T$) 262. The delay block 262 has the same delay as the filter 260. In exemplary embodiments, the Hilbert filter 260 ideally has a unity gain over the full bandwidth and a constant phase shift of either +90 or −90 degrees depending upon whether the frequencies are positive or negative. Additional discussion of exemplary embodiments of Hilbert filter 260 is provided further below.

The Hilbert transform provided at the output of filter 260 and the delayed derivative of the filtered signal $z_n$ provided at the output of delay block 262 are provided as inputs to mixer circuit 264. Like mixer circuit 216, mixer circuit 264 illustrates one of M-1 mixing functions which are implemented in parallel. M-1 complex signal pairs $z^i_{B,I}$ 266, $z^i_{B,R}$ 268 are created by using multipliers 263 to mix the derivative of $z_n$ and its Hilbert transform with sinusoids at integer multiples of $f_s/M$ as discussed above, which due to the relationship between the mixer frequencies and $f_s$ have a simple representation, thus mixing the input tones up to one of the skew spur locations. This mixed derivative of the filtered signal $z_n$ ($z^i_{B,R}$ and $z^i_{B,I}$) 266, 268 is provided to product or multiplier circuitry 270, 272 to produce cross-correlation 274, 276 between the mixed derivative of the filtered signal $z_n$ ($z^i_{B,R}$ and $z^i_{B,I}$) and a delayed filtered signal $z_n$ 281, with the delayed filtered signal 281 being provided to product or multiplier circuitry 270, 272 through series delay blocks ($\Delta T$) 278, 280. The cross-correlation 274, 276 between the mixed derivative of the filtered signal $z_n$ ($z^i_{B,R}$ and $z^i_{B,I}$) and the delayed filtered signal $z_n$ is itself used to update the weights. A larger cross-correlation means that the spur is still present in the corrected output signal and thus the weight needs to be increased. Vice versa, a small correlation means that the basis functions are scaled adequately to remove the spurs and thus the weights require little to no updates. As mentioned above, the weights can be initially set to zero and increased to reduce the cross-correlation. The notch filter ($H_N$) 252 'blocks' training when the frequency of the input signal is close to $f_s/M$, as the modulation of such input signal will falsely mark the input itself as spurious content. The cross-correlation 274, 276 is scaled, using product or multiplier circuitry 282, 284, by a factor 'μ' which is the learning rate and is configurable to produce the scaled cross-correlation 286, 288. Learning rate factor is chosen by designers of a particular implementation of weight updating circuitry based upon testing. Too large of a value of the learning rate factor will result in an unstable system, while too small of a learning rate factor will result in a the time required to reach a sufficient performance correction to be lengthy. The scaled cross-correlation 286, 288 is added to the weight values 226, 228, using addition circuit 290, 292, to produce newly updated weight values 294, 296. The newly updated weight values 294, 296 can be stored in weight storage 229 and used by correction circuitry 200 as weight values 226, 228 in the next cycle to scale the basis functions.

Figure 3:
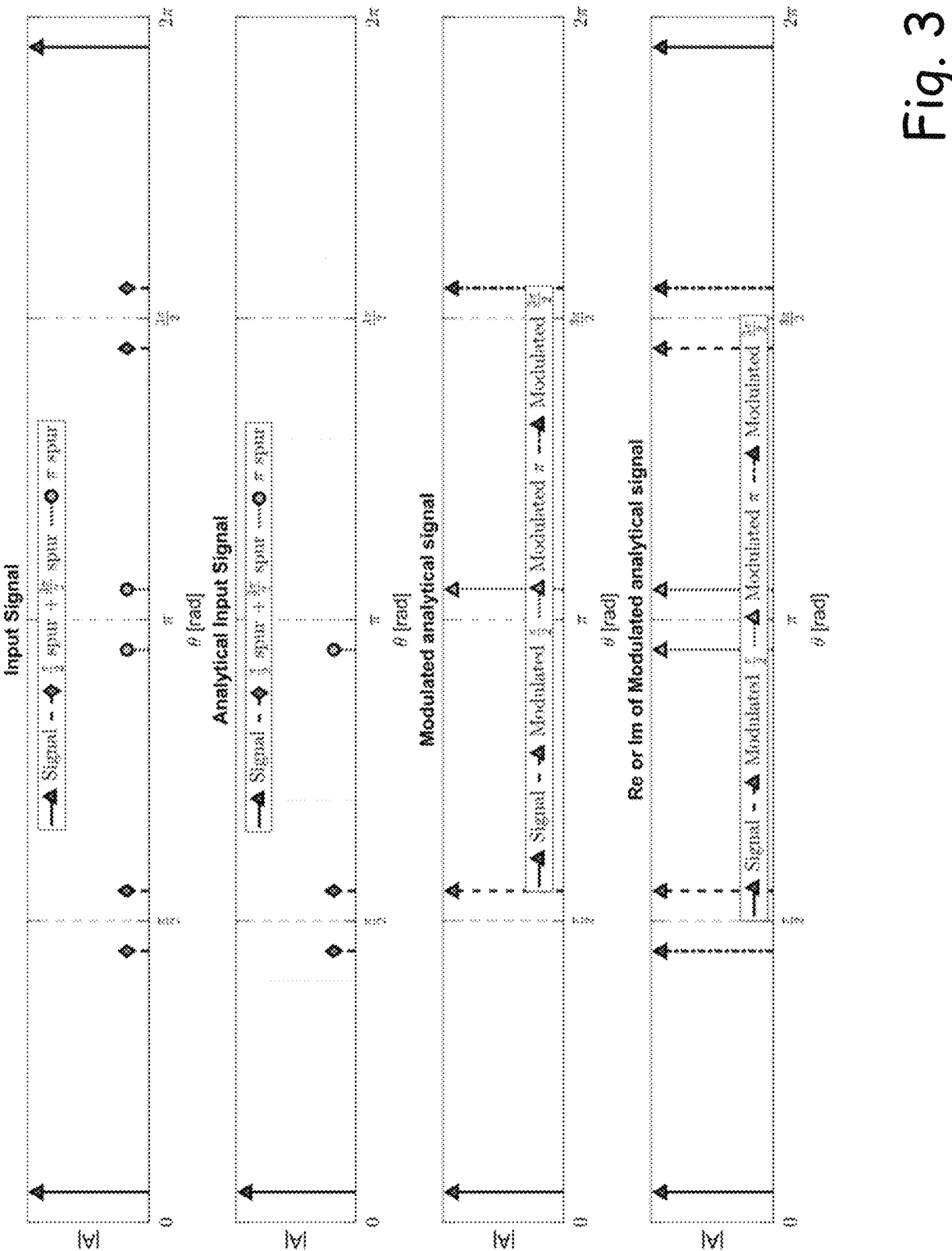
FIG. 3 illustrates frequency spectrum diagrams of an analytical signal and modulated versions thereof.

Referring to FIG. 3, shown as an example are the frequency spectra of an analytical signal and modulated versions thereof (for TI=4). Note that the amplitudes of the signals are not to scale, and that for the modulated signal, only the shifted signal component is being shown. In FIG. 1, the spectral content of the TI ADC with a single-tone input is depicted. In FIG. 3, the second plot depicts the analytical signal (i.e. y'(n)+jy'$_h$(n)) created using the Hilbert transform. Note that the analytical signal only contains spectral components within the interval 0≤θ<π. Such an analytical signal can then be mixed using the mixers such as depicted in FIG. 2, which results in the modulated analytical signal (third plot of FIG. 3). The real and imaginary part of the complex spectrum shows the same magnitude response but having a different phase. FIG. 3 illustrates the concept of mixing a signal to the different frequencies (i.e., the behavior of the mixer), but is provided as an example and does not correspond directly to outputs of specific nodes in FIG. 2.

Mixing the complex signal to the time-interleaving spur frequencies can be mathematically described by:

$$y^i_{B,R} = \Re\left\{e^{j\frac{2\pi ni}{M}} \cdot (y'(n) + jy'_h(n))\right\} = \qquad \text{Equations 1}$$

$$\cos\left(\frac{2\pi ni}{M}\right)y'(n) - \sin\left(\frac{2\pi ni}{M}\right)y'_h(n)$$

$$y^i_{B,I} = \Im\left\{e^{j\frac{2\pi ni}{M}} \cdot (y'(n) + jy'_h(n))\right\} = \sin\left(\frac{2\pi ni}{M}\right)y'(n) + \cos\left(\frac{2\pi ni}{M}\right)y'_h(n)$$

where i={1,2, . . . , M-1}, 'n' denotes a point in discrete time (sampled at the system sample rate f$_s$) and y'$_h$(n) is the Hilbert transform of y'(n). These are the basis functions for the correction algorithm.

If the basis functions are multiplied with a certain weight, the modulated signal components can be altered in such a way that the time-interleaving spurs will be cancelled. The correction algorithm can be applied to TI ADCs with any number of channels. For each added TI channel, two basis functions (one real and one imaginary) are created.

Figure 4:
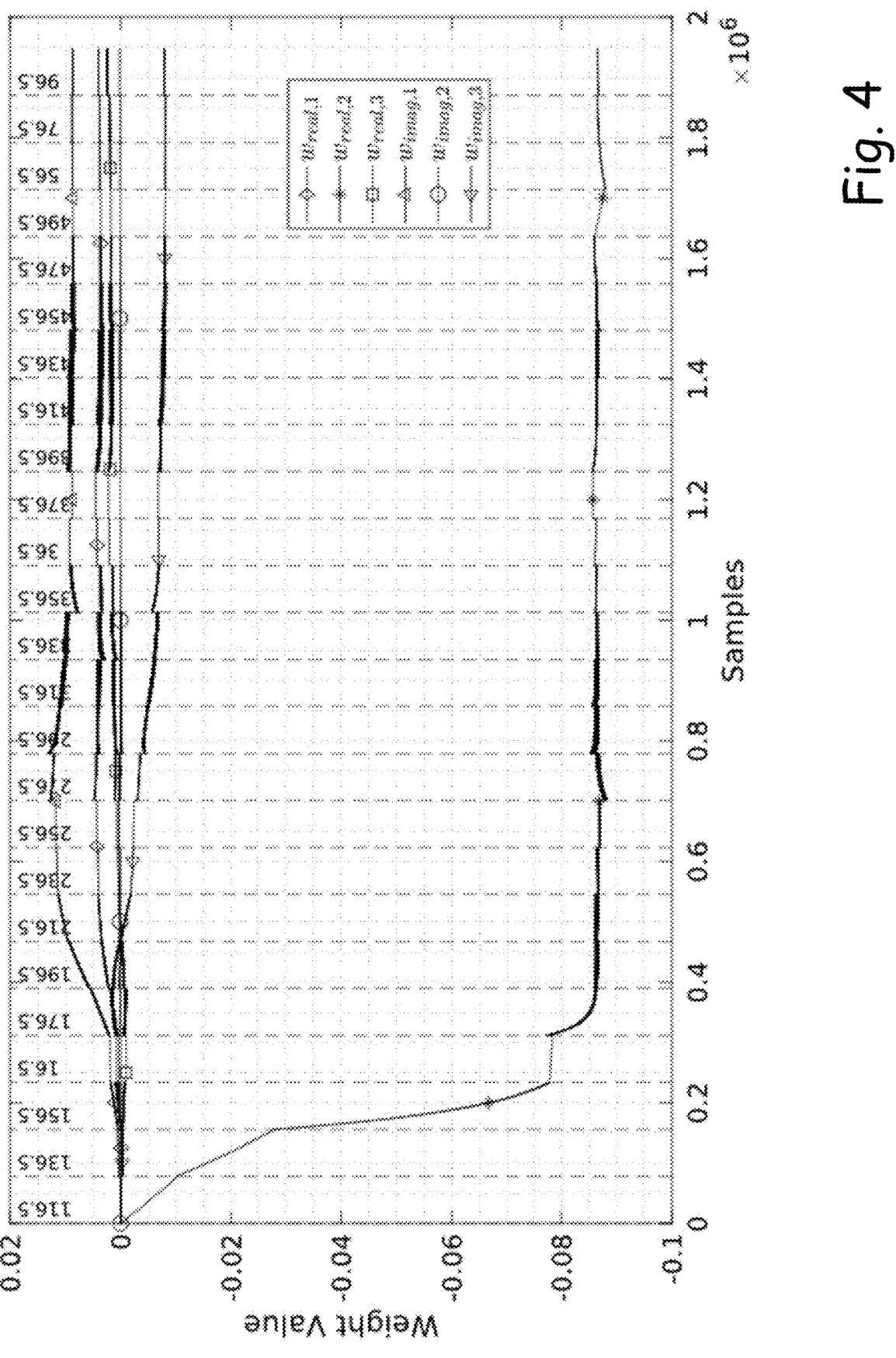
FIG. 4 illustrates updated weight values over time produced by the weight updating circuitry shown in FIG. 2.

The algorithm was tested using a MATLAB model with various TI configurations having different amount of skew added to each channel. Additionally, different frequencies and multi-tone inputs were tested. The sampling frequency of the ADC is 1.0 GHz. In FIG. 4, showing updated weight values over time, the dotted lines denote switching to a different input frequency tone with the number indicating the input frequency in MHz.

Scenario 1
  Number of TI Channels: 4
  Skew of each channel: [0.45%-0.9% 0.75%-1.0%] of Ts
  Input frequencies: single tone from 16.5 MHz up to 496.5 MHz.

Figure 5:
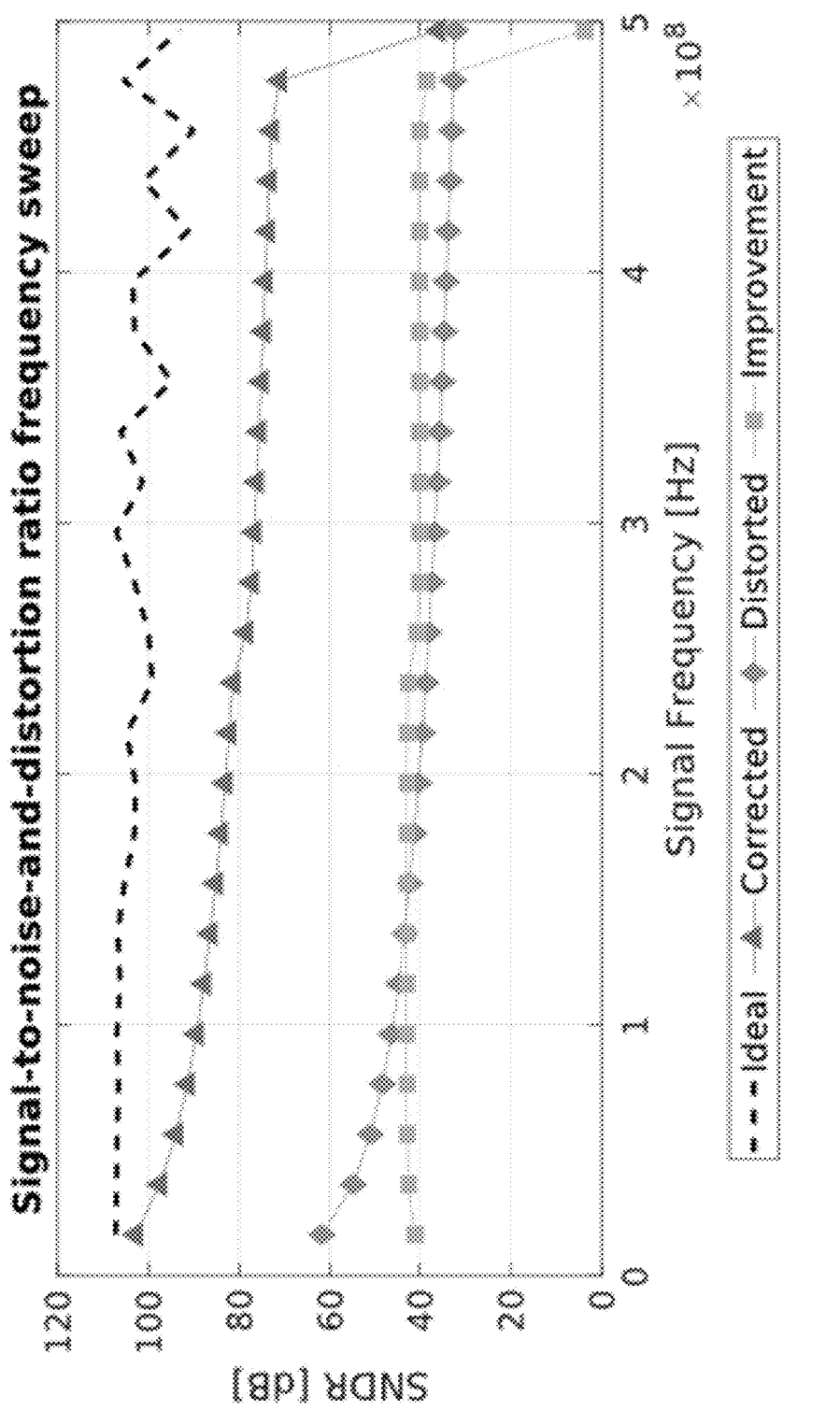
FIG. 5 illustrates signal-to-noise-and-distortion ratios (SNDRs) over a frequency range for a first exemplary scenario, demonstrating improvement of the SNDR over the frequency range using the calibration and weight updating circuit shown in FIG. 2.
Figure 6:
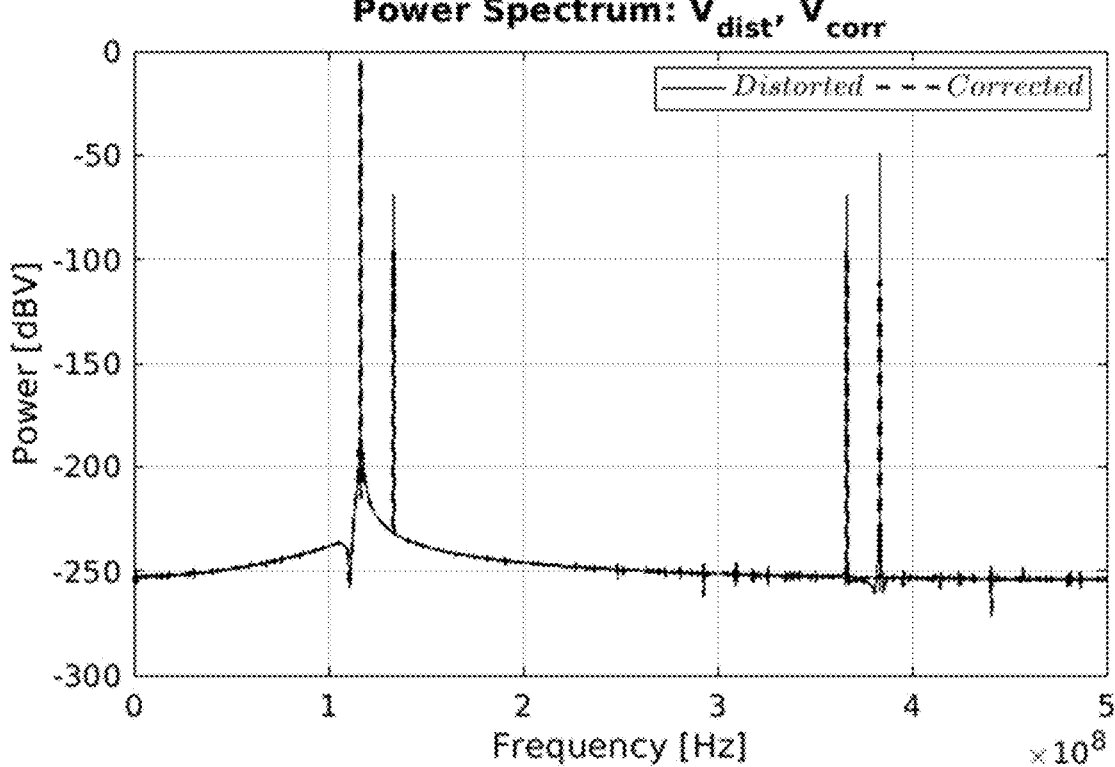
FIG. 6 illustrates a power spectrum of a multi-tone input in a second exemplary scenario produced by the weight updating circuitry shown in FIG. 2.

After obtaining the correct weight values, all input frequencies were tested to measure the signal-to-noise-and-distortion-ratio (SNDR) improvement using the learned weights. In FIG. 5 the improvement of the SNDR over the full frequency range is shown. The corrective ability of the algorithm has a sudden drop near f$_s$/2 (496.5 MHz in this example) due to the finite number of coefficients that are used to implement both the Hilbert filter H$_{HIL}$ and the derivative filter H$_D$. To explain this deterioration, one can review the alteration of the transfer function of the aforementioned filters due to the finite number of coefficients. FIG. 6 illustrates the power spectrum of a single-tone input.

Figure 7:
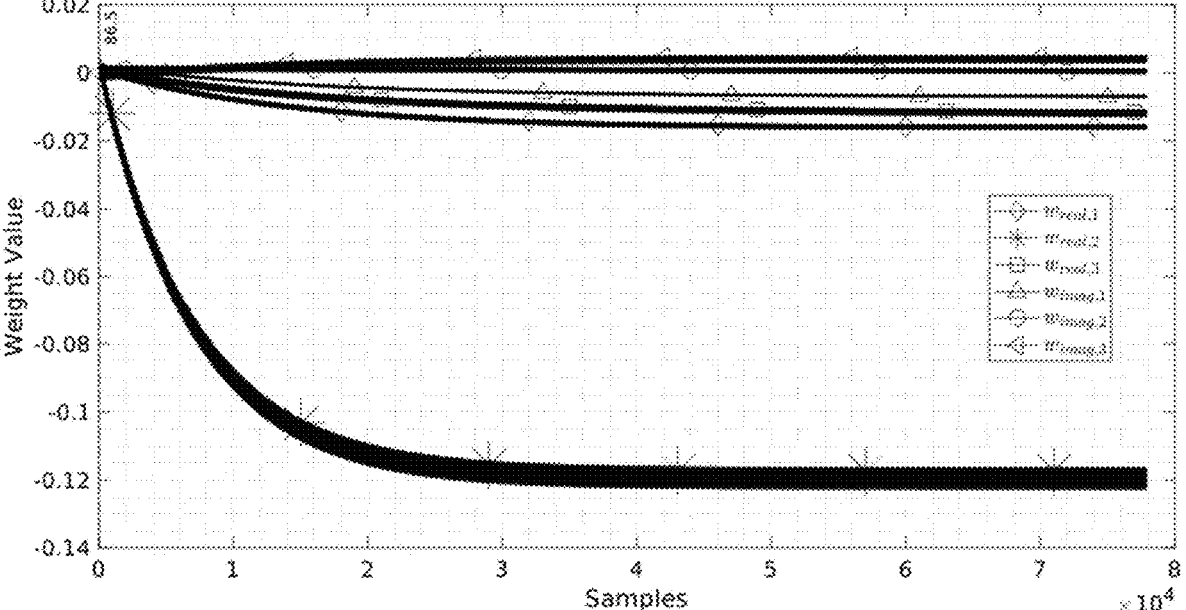
FIG. 7 illustrates updated weight values over time for a multi-tone input produced by the weight updating circuitry shown in FIG. 2 in the second exemplary scenario.
Figure 8:
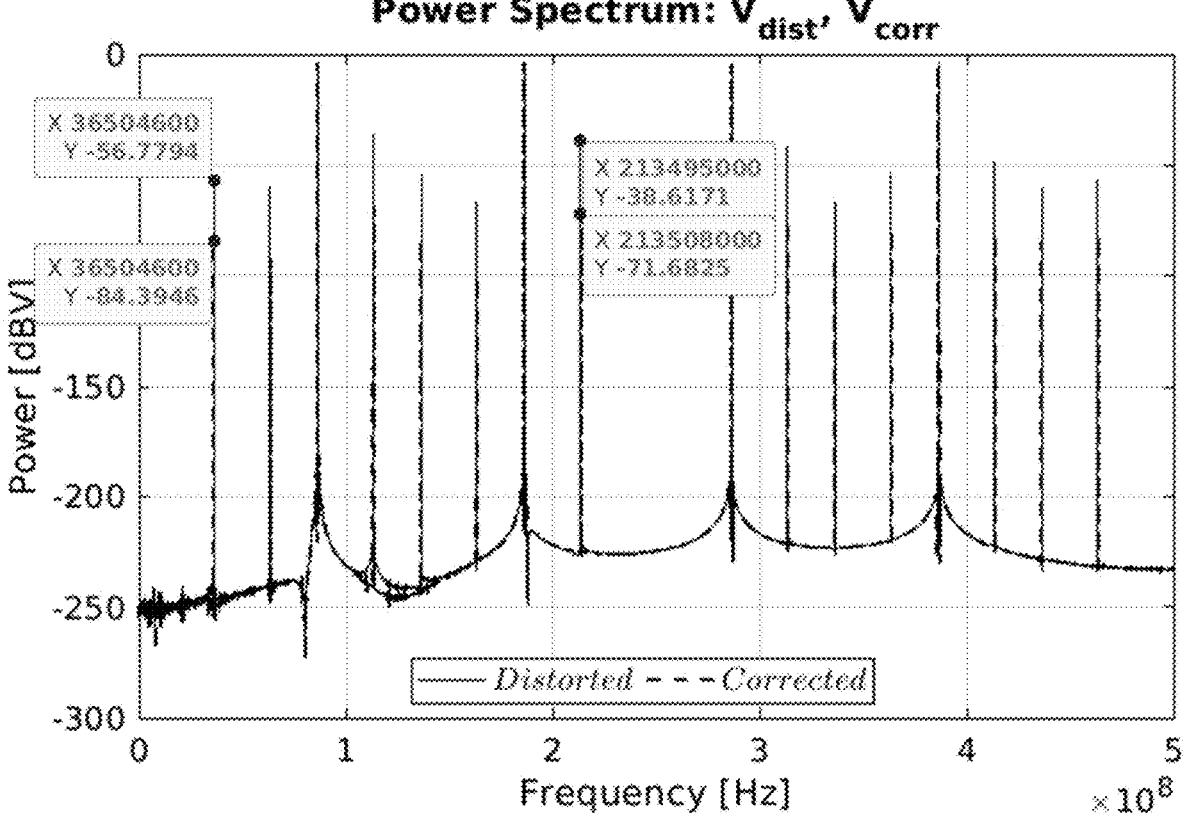
FIG. 8 illustrates a power spectrum of a multi-tone input in the second exemplary scenario.

Scenario 2
  Number of TI Channels: 4
  Skew of each channel: [1%-1.5% 0.8%-1%]*Ts
  Input frequencies: multi tone at 166.5, 186.5, 206.5, 226.5 MHz and at 86.5, 186.5, 286.5, 386.5 MHz One of the improvements provided by disclosed embodiments is that the weights learned are frequency independent (since the frequency dependency is removed by the derivative filter). Therefore, the weights need not to be updated by a change of frequency of the input signal. Furthermore, the correction algorithms functions correctly when multi-tone signals are used as an input to the ADC, even when the frequencies of the tones are spaced further apart. For Scenario 2, FIG. 7 illustrates updated weight values over time for a multi-tone input with input frequencies of 86.5 MHz, 186.5 MHz, 286.5 MHz and 386.5 MHz. FIG. 8 illustrates the power spectrum of a multi-tone input with input frequencies of 86.5 MHz, 186.5 MHz, 286.5 MHz and 386.5 MHz. As can be seen, compared to prior art systems and methods, the disclosed methods and algorithms do not break when the frequencies of the input tones to the ADC are spaced further apart.

Figure 9:
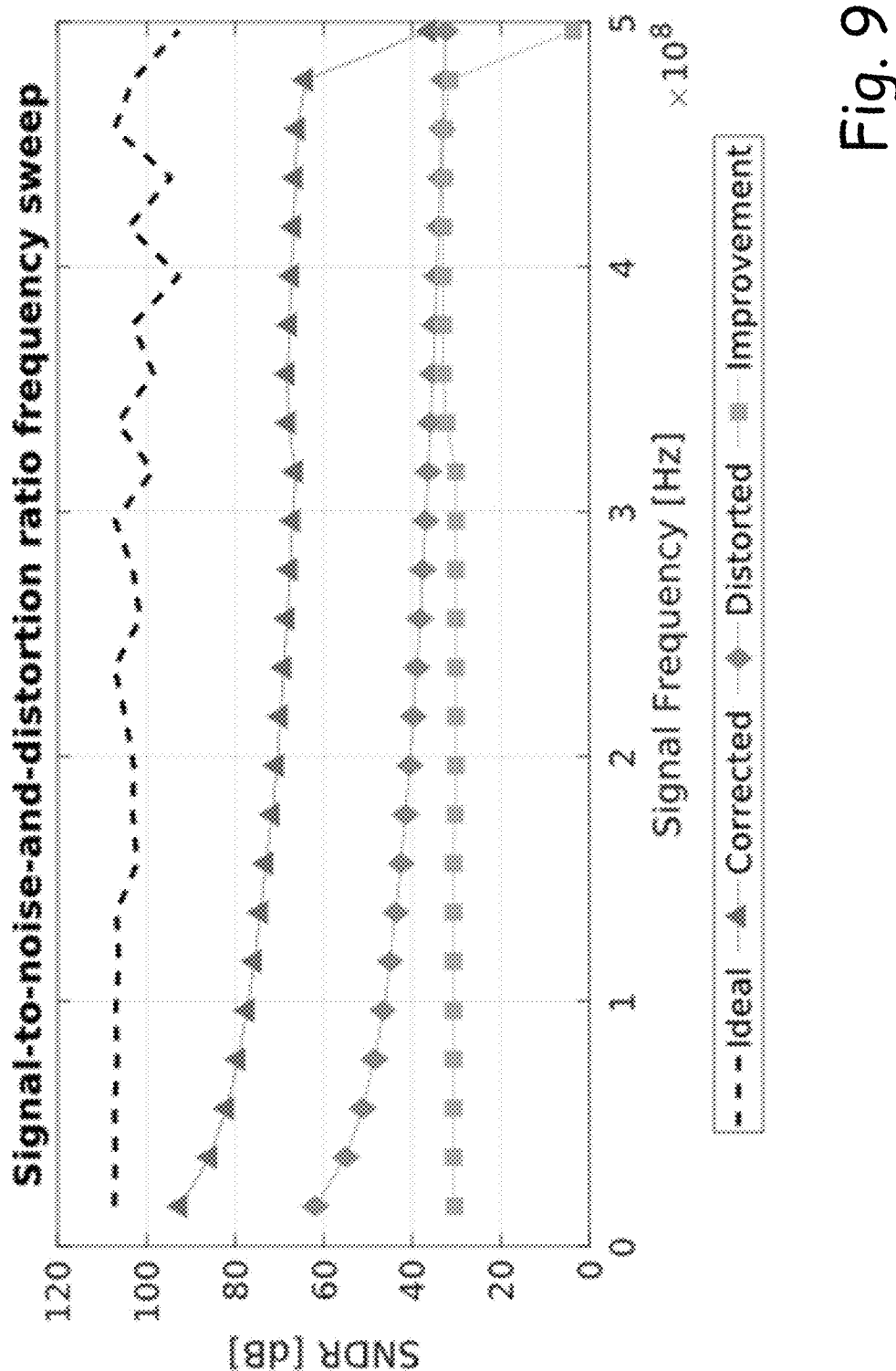
FIG. 9 illustrates the SNDR over a frequency range of the ADC in a third exemplary scenario produced by the weight updating circuitry shown in FIG. 2.

Scenario 3
  Number of TI Channels: 6
  Skew of each channel: [−1.0% 0.9% 0.45% 0.75%-0.9% 0.45%]*Ts
  Input frequencies: single tone from 16.5 MHz up to 496.5 MHz FIG. 9 illustrates the SNDR over the full frequency range of the ADC for Scenario 3.

Referring back to FIG. 2, the Hilbert filters 212, 260 ideally have a phase shift of +90 degrees for negative frequencies and −90 degrees for positive frequencies. The frequency response of the Hilbert transform is:

$$H_{HIL}(j\omega) = \begin{cases} +j & \text{if } \omega < 0 \\ 0 & \text{if } \omega = 0 \\ -j & \text{if } \omega > 0 \end{cases} \qquad \text{Equation 2}$$

Therefore, the magnitude of the response should be unity across the bandwidth. The effect of filter truncation can be lessened by multiplying the filter coefficients with a window such as the hanning window.

In exemplary embodiments, the derivative filters 208, 256 shown in FIG. 2 are implemented using the following FIR filter weights:

$$h_D(n) = \begin{cases} 0 & \text{if } n = 0 \\ \dfrac{1}{n}(-1)^n & \text{if } n \neq 0 \end{cases} \qquad \text{Equation 3}$$

The derivative filter ideally has the following frequency response:

$$H_D(j\omega) = j\omega \qquad \text{Equation 4}$$

Such frequency response means a magnitude increase of 20 dB/decade and a constant phase shift of +90 degrees for positive frequencies and −90 degrees for negative frequencies. The derivative filter can become inaccurate when nearing the Nyquist frequency, causing difficulty for the calibration algorithm in correcting frequencies that are very close to the Nyquist frequency. Application of a Hanning window can be used to reduce the non-ideal characteristics caused by the finite number of coefficients in the FIR filter.

In exemplary embodiments, the notch filter 252 is used to avoid distortion of the learning process when the input signal contains spectral content that is very close to the frequencies at which the time interleaving spurs appear. For example, in a TI system where the interleaving factor is 4, time-interleaving spurs will appear at $$\theta = \frac{\pi}{2}, , \theta = \pi, \text{ and } \theta = \frac{3\pi}{2}.$$

Figure 10:
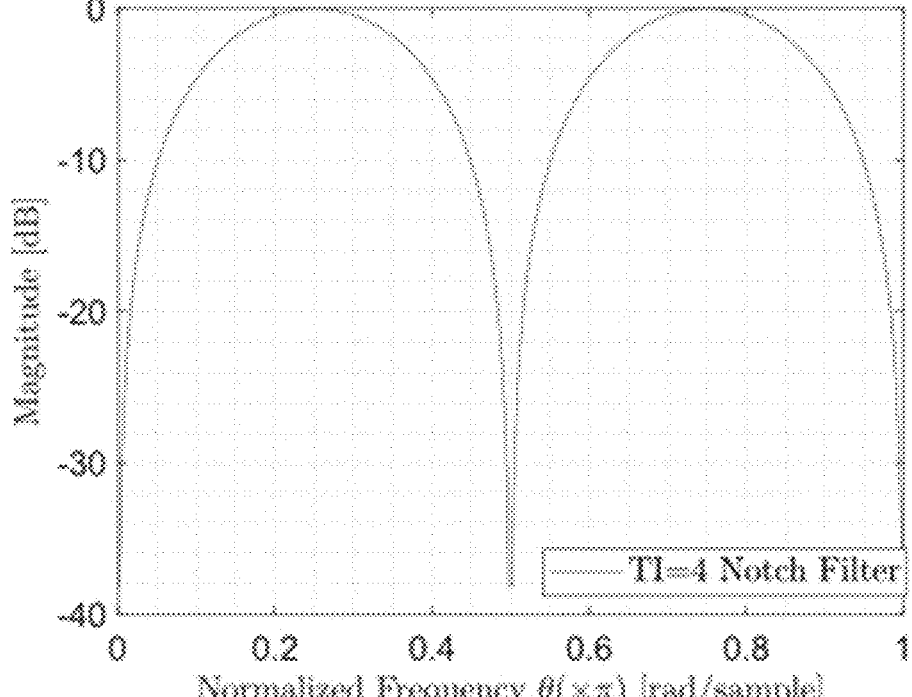
FIG. 10 illustrates a transfer function of a linear-phase notch filter which can be used in the ADC calibration circuit shown in FIG. 2.

Now if the input signal has spectral content located at $$\theta = \frac{\pi}{2},$$

the weight updating portion of the method or algorithm implemented by circuitry 250 will find a high correlation between the modulated signal (modulated with θ=π) and the input signal, leading to erroneously increasing the weight (i.e., the algorithm tries to get rid of the input signal itself). Clearly, spectral content in the input signal that is near the mixer frequencies should not be used for updating the weights. To avoid this issue, a notch filter is applied in the 'weight updating part' of the algorithm by circuitry 250. By applying the notch filter 252, the spectral content that is closely spaced to the mixing frequencies is suppressed thus the cross-correlation (which determines the weight update step) becomes very small for input frequencies that are closely spaced to the mixing frequencies. An example linear-phase notch filter for TI=4 is shown in FIG. 10. These filters are easily constructed, for example by using a comb filter.

ADC Slice Bandwidth Mismatch

Bandwidth mismatch between different ADC slices causes similar spectral distortion compared to time skew induced errors. Although both time skew and bandwidth mismatch show spurious content at the same frequencies, an important difference between them is the way that each individual channel is affected. For time skew, the magnitude of the error spurs is a function of all ADC slice's time skew and the input frequency of the signal. Each channel has a different phase shift, but the frequency dependency of the error is the same for all errors, namely a single zero at DC (derivative filter). For each spur, only the phase and magnitude need to be learned, but not the frequency response. For the bandwidth-mismatch problem on the other hand, the spurs will be formed by the bandwidth mismatch in each channel. As a simple approximation for the effects of the mismatch, the bandwidth of each channel can be modelled as a single-pole network. This first order approximation is therefore made using a single pole at some cut-off frequency; the location of the pole differs for each channel. This means that the frequency dependency is, in this case, not equal for all ADC slices.

The time skew correction relies on linearizing the relation between the input frequency and the magnitude of the time skew induced error (i.e., taking the 1st order Taylor approximation of e^(j*phi)). For bandwidth mismatch, the same can be done, but only after assuming the cut-off frequency of the pole is spaced sufficiently higher than fs, as there is a possibility that this is the case. For clarification, FIG. 11 shows the difference between the two errors for a 2-way interleaved system. As can be seen in FIG. 11, if the assumption for a valid Taylor Expansion is met, the bandwidth mismatch error can be linearized and thus should be correctable using the disclosed calibration system.

Features described herein with respect to one embodiment may be implemented in other embodiments herein.

In one embodiment, a circuit 150 includes TI ADC circuitry 204 configured to receive input signals 202 and to responsively generate digital output signals 206. The circuit includes correction circuitry 200 configured to receive the digital output signals from the ADC circuitry and to responsively generate corrected output signal 236 using complex weight values 226, 228. The correction circuitry including a first derivative filter 208 configured to generate a derivative 210 of the digital output signals to remove frequency dependency between the weight values and the input signals. The first derivative filter is a finite impulse response (FIR) filter in exemplary embodiments. The circuit also includes weight updating circuitry 250 configured to receive the corrected output signal 236 and to responsively generate updated weight values 294, 296. The weight updating circuitry includes a notch filter 252 configured to filter the corrected output signal 236 to generate filtered corrected output signals 254. The notch filter suppresses any input tones from the corrected output signals around integer multiples of f_s/M, where f_s is a sampling frequency and M is a time-interleaving factor, in the filtered corrected output signals. The weight updating circuitry generates the updated weight values using the filtered corrected output signals.

The correction circuitry 200 includes, in exemplary embodiments, a first Hilbert filter 212 configured to receive the derivative 210 of the digital output signals and to responsively generate a Hilbert transform of the derivative of the digital output signals. The correction circuitry 200 also includes a first delay circuit 214 configured to receive the derivative of the digital output signals and to provide a delayed derivative of the digital output signals. Mixer circuits 216 are also included in the correction circuit. The first mixer is coupled to the first Hilbert filter and to the first delay circuit, and the first mixer generates first complex signals 218, 220 by mixing the Hilbert transform of the derivative of the digital output signals and the delayed derivative of the digital output signals with sinusoids at integer multiples of f_s/M. The first mixer generates the first complex signals such that input tones of the first complex signals are mixed up to a frequency of a time skew spur location.

The correction circuit also includes a first product circuit 222, 224 configured to multiply the first complex signals 218, 220 by the complex weight values 294, 296 to produce first weighted complex signals 230, 232. A subtraction circuit 234 of the correction circuit is configured to subtract the first weighted complex signals 230, 232 from the digital output signals 206 to produce the corrected output signal 236.

The weight updating circuitry 250 includes a second derivative filter 256 that is configured to generate a derivative 258 of the filtered corrected output signals 254. A second Hilbert filter 260 of the circuit 150 is included in the weight updating circuitry 250. The Hilbert filter 260 receive the derivative 258 of the filtered corrected output signals 254 and responsively generates a Hilbert transform of the derivative of the filtered corrected output signals. A second delay circuit 262 provides a delayed derivative of the filtered corrected output signals. A second mixer circuit 264 of circuit 150 is also included in the weight updating circuitry. The mixer circuit 264 is configured to generate second complex signals 266, 268 by mixing the Hilbert transform of the derivative of the filtered corrected output signals and the delayed derivative of the filtered corrected output signals with sinusoids at integer multiples of $f_s/M$. A third delay circuit 278, 280 is configured to receive the filtered corrected output signals (254) and to provide delayed filtered corrected output signals (281). Product circuit 270, 272 of the weight updating circuitry produces cross-correlation 274, 276 between the second complex signals 266, 268 and the delayed filtered corrected output signals 281, and the weight updating circuitry generates the updated weight values 294, 296 as a function of the cross-correlation. Product circuit 282, 284 of the weight updating circuitry scales the cross-correlation by a learning rate factor to produce a scaled cross-correlation 286, 288, and an addition circuit 290, 292 adds the scaled cross correlation to the weight values to produce the updated weight values.

In another embodiment, a circuit 150 includes TI ADC circuitry 204 configured to receive input signals 202 and to responsively generate digital output signals 206. The TI ADC circuitry 204 outputs the time-multiplexed output of M ADC channels, where $f_s$ is a sampling frequency. The circuit includes correction circuitry 200 that is configured to receive the digital output signals from the ADC circuitry and to responsively generate corrected output signal 236 using complex weight values 226, 228. The correction circuitry includes a first derivative filter 208 configured to generate a derivative 210 of the digital output signals 206. The corrected output signals are generated based upon the derivative of the digital output signals. The circuit 150 also includes weight updating circuitry 250 configured to receive the corrected output signal 236 and to responsively generate updated complex weight values 294, 296 to replace the complex weight values 226, 228 for use by the correction circuitry. The weight updating circuitry includes a notch filter 252 configured to filter the corrected output signal 236 to suppress spectral content in the corrected output signals, at frequencies where time-interleaving spurs occur, to generate filtered corrected output signals 254. The notch filter suppresses any input tones from the corrected output signals around integer multiples of $f_s/M$. The updated complex weight values 294, 296 are generated using the filtered corrected output signals.

The correction circuitry 200 includes a first Hilbert filter 212 configured to receive the derivative 210 of the digital output signals 206 and to responsively generate a Hilbert transform of the derivative of the digital output signals. The first Hilber filter has a unity gain and a constant phase shift of either +90 or −90 degrees depending upon whether the frequencies are positive or negative. The correction circuit also includes a first delay circuit 214 configured to receive the derivative of the digital output signals and to provide a delayed derivative of the digital output signals. A first mixer circuit 216 is coupled to the first Hilbert filter and to the first delay circuit. The first mixer circuit generates first complex signals 218, 220 by mixing the Hilbert transform of the derivative of the digital output signals and the delayed derivative of the digital output signals with sinusoids at integer multiples of $f_s/M$. The first mixer circuit generates the first complex signals 218, 220 such that input tones of the first complex signals are mixed up to the frequencies where time-interleaving spurs occur. A first product circuit 222, 224 of the correction circuitry is configured to multiply the first complex signals by the complex weight values to produce first weighted complex signals 230, 232. A subtraction circuit 234 of the correction circuitry is configured to subtract the first weighted complex signals 230, 232 from the digital output signals 206 to produce the corrected output signal 236.

The circuit 150 also includes a second derivative filter 256, in the weight updating circuitry 250, configured to generate a derivative 258 of the filtered corrected output signals 254. A second Hilbert filter 260 included in the weight updating circuitry is configured to receive the derivative of the filtered corrected output signals and to responsively generate a Hilbert transform of the derivative of the filtered corrected output signals. A delay circuit 262 of the weight updating circuitry is configured to receive the derivative of the filtered corrected output signals and to provide a delayed derivative of the filtered corrected output signals. The circuit 150 also includes a second mixer circuit 264, in the weight updating circuitry, coupled to the second Hilbert filter and to the second delay circuit. The second mixer circuit is configured to generate second complex signals 266, 268 by mixing the Hilbert transform of the derivative 258 of the filtered corrected output signals and the delayed derivative of the filtered corrected output signals with sinusoids at integer multiples of $f_s/M$.

The weight updating circuitry 250 also includes a third delay circuit 278, 280 configured to receive the filtered corrected output signals (254) and to provide delayed filtered corrected output signals (281), and a product circuit 270, 272 configured to produce cross-correlation 274, 276 between the second complex signals 266, 268 and the delayed filtered corrected output signals 281. Another product circuit 282, 284 is configured to scale the cross-correlation 274, 276 by a learning rate factor to produce a scaled cross-correlation 286, 288. An addition circuit 290, 29 is configured to add the scaled cross correlation to the weight values 226, 228 to produce the updated weight values 294, 296.

Although the present invention has been described with reference to preferred embodiments, workers skilled in the art will recognize that changes may be made in form and detail without departing from the scope of the discussion.

What is claimed is:

1. A circuit comprising:
    time-interleaved (TI) analog-to-digital converter (ADC) circuitry configured to receive input signals and to responsively generate digital output signals;
    correction circuitry configured to receive the digital output signals from the TI ADC circuitry and to responsively generate a corrected output signal using weight values, the correction circuitry including a first derivative filter; and
    weight updating circuitry configured to receive the corrected output signal and to responsively generate updated weight values, the weight updating circuitry including a notch filter configured to filter the corrected output signal to generate filtered corrected output signals, the weight updating circuitry further configured to generate the updated weight values using the filtered corrected output signals.

2. The circuit of claim 1, wherein the first derivative filter is a finite impulse response (FIR) derivative filter configured to remove frequency dependency between the input signals and calibrated coefficients used in the correction circuitry.

3. The circuit of claim 1, wherein the weight updating circuitry is configured to provide the updated weight values to the correction circuitry to replace the weight values, and wherein the correction circuitry is configured to use the updated weight values to generate the corrected output signal.

4. The circuit of claim 1, wherein the TI ADC circuitry provides the digital output signals as sequentially generated outputs of 'M' ADC channels.

5. The circuit of claim 1, wherein the correction circuitry further comprises:

a first Hilbert filter configured to receive the derivative of the digital output signals and to responsively generate a Hilbert transform of the derivative of the digital output signals;

a first delay circuit configured to receive the derivative of the digital output signals and to provide a delayed derivative of the digital output signals; and a first mixer circuit coupled to the first Hilbert filter and to the first delay circuit, the first mixer circuit configured to generate first complex signals by mixing the Hilbert transform of the derivative of the digital output signals and the delayed derivative of the digital output signals with sinusoids.

6. The circuit of claim 5, wherein the first mixer circuit is configured to generate the first complex signals by mixing the Hilbert transform of the derivative of the digital output signals and the delayed derivative of the digital output signals with sinusoids at integer multiples of $f_s/M$, where $f_s$ is a sampling frequency and M is a time-interleaving factor.

7. The circuit of claim 5, wherein the first mixer circuit is configured to generate the first complex signals such that input tones of the first complex signals are mixed up to a frequency of a time skew spur location.

8. The circuit of claim 7, wherein the first mixer circuit comprises M-1 parallel first mixer circuits each configured to apply M-1 mixing functions to mix the Hilbert transform of the derivative of the digital output signals and the delayed derivative of the digital output signals.

9. The circuit of claim 5, wherein the weight values are complex weight values, and wherein the correction circuitry further comprises:

a first product circuit configured to multiply the first complex signals by the complex weight values to produce first weighted complex signals;

a subtraction circuit configured to subtract the first weighted complex signals from the digital output signals to produce the corrected output signal.

10. The circuit of claim 1, wherein the notch filter of the weight updating circuitry is configured to suppress any input tones from the corrected output signal around integer multiples of $f_s/M$ in the filtered corrected output signals.

11. The circuit of claim 5, wherein the weight updating circuitry further comprises:

a second derivative filter configured to generate a derivative of the filtered corrected output signals;

a second Hilbert filter configured to receive the derivative of the filtered corrected output signals and to responsively generate a Hilbert transform of the derivative of the filtered corrected output signals;

a second delay circuit configured to receive the derivative of the filtered corrected output signals and to provide a delayed derivative of the filtered corrected output signals; and a second mixer circuit coupled to the second Hilbert filter and to the second delay circuit, the second mixer circuit configured to generate second complex signals by mixing the Hilbert transform of the derivative of the filtered corrected output signals and the delayed derivative of the filtered corrected output signals with sinusoids at integer multiples of $f_s/M$.

12. The circuit of claim 11, wherein the weight updating circuitry further comprises:

a third delay circuit configured to receive the filtered corrected output signals and to provide delayed filtered corrected output signals; and a second product circuit configured to produce cross-correlation between the second complex signals and the delayed filtered corrected output signals, wherein the weight updating circuitry is further configured to generate the updated weight values as a function of the cross-correlation.

13. The circuit of claim 12, wherein the weight updating circuitry further comprises:

a third product circuit configured to scale the cross-correlation by a learning rate factor to produce a scaled cross-correlation; and an addition circuit configured to add the scaled cross-correlation to the weight values to produce the updated weight values.

14. A circuit comprising:

time-interleaved (TI) analog-to-digital converter (ADC) circuitry configured to receive input signals and to responsively generate digital output signals, the TI ADC circuitry providing sequentially generated outputs of 'M' ADC channels, where $f_s$ is a sampling frequency;

correction circuitry configured to receive the digital output signals from the TI ADC circuitry and to responsively generate a corrected output signal using complex weight values, the correction circuitry including a first derivative filter configured to generate a derivative of the digital output signals, wherein the corrected output signal is generated based upon the derivative of the digital output signals; and weight updating circuitry configured to receive the corrected output signal and to responsively generate updated complex weight values to replace the complex weight values for use by the correction circuitry.

15. The circuit of claim 14, wherein the weight updating circuitry includes a notch filter configured to filter the corrected output signal to suppress spectral content in the corrected output signals, at frequencies where time-interleaving spurs occur, to generate filtered corrected output signals, the weight updating circuitry further configured to generate the updated complex weight values using the filtered corrected output signals.

16. The circuit of claim 15, wherein the correction circuitry further comprises:

a first Hilbert filter configured to receive the derivative of the digital output signals and to responsively generate a Hilbert transform of the derivative of the digital output signals, wherein the first Hilbert filter has a unity gain and a constant phase shift of +90 or −90 degrees;

a first delay circuit configured to receive the derivative of the digital output signals and to provide a delayed derivative of the digital output signals; and a first mixer circuit coupled to the first Hilbert filter and to the first delay circuit, the first mixer circuit configured to generate first complex signals by mixing the Hilbert transform of the derivative of the digital output signals and the delayed derivative of the digital output signals with sinusoids at integer multiples of $f_s/M$.

17. The circuit of claim 16, wherein the first mixer circuit is configured to generate the first complex signals such that input tones of the first complex signals are mixed up to the frequencies where time-interleaving spurs occur.

18. The circuit of claim 17, wherein the correction circuitry further comprises:

a first product circuit configured to multiply the first complex signals by the complex weight values to produce first weighted complex signals;

a subtraction circuit configured to subtract the first weighted complex signals from the digital output signals to produce the corrected output signal.

19. The circuit of claim 15, wherein the notch filter of the weight updating circuitry is configured to suppress any input tones from the corrected output signal around integer multiples of $f_s/M$.

20. The circuit of claim 15, wherein the weight updating circuitry further comprises:

a second derivative filter configured to generate a derivative of the filtered corrected output signals;

a second Hilbert filter configured to receive the derivative of the filtered corrected output signals and to responsively generate a Hilbert transform of the derivative of the filtered corrected output signals;

a second delay circuit configured to receive the derivative of the filtered corrected output signals and to provide a delayed derivative of the filtered corrected output signals;

a second mixer circuit coupled to the second Hilbert filter and to the second delay circuit, the second mixer circuit configured to generate second complex signals by mixing the Hilbert transform of the derivative of the filtered corrected output signals and the delayed derivative of the filtered corrected output signals with sinusoids at integer multiples of $f_s/M$;

a third delay circuit configured to receive the filtered corrected output signals and to provide delayed filtered corrected output signals;

a second product circuit configured to produce cross-correlation between the second complex signals and the delayed filtered corrected output signals;

a third product circuit configured to scale the cross-correlation by a learning rate factor to produce a scaled cross-correlation; and an addition circuit configured to add the scaled cross-correlation to the weight values to produce the updated weight values.

* * * * *